United States Patent
Pulipati et al.

(10) Patent No.: US 11,423,952 B2
(45) Date of Patent: Aug. 23, 2022

(54) MULTI-CHIP DEVICES

(71) Applicant: XILINX, INC., San Jose, CA (US)

(72) Inventors: Narendra Kumar Pulipati, Hyderabad (IN); Sree RKC Saraswatula, Hyderabad (IN); Santosh Yachareni, Hyderabad (IN); Shidong Zhou, Milpitas, CA (US)

(73) Assignee: XILINX, INC., San Jose, CA (US)

( * ) Notice: Subject to any disclaimer, the term of this patent is extended or adjusted under 35 U.S.C. 154(b) by 322 days.

(21) Appl. No.: 16/715,249

(22) Filed: Dec. 16, 2019

(65) Prior Publication Data

US 2021/0183412 A1     Jun. 17, 2021

(51) Int. Cl.
| | |
|---|---|
| *G11C 5/14* | (2006.01) |
| *H01L 25/18* | (2006.01) |
| *H03K 19/003* | (2006.01) |
| *H03K 19/0185* | (2006.01) |
| *H03K 19/094* | (2006.01) |

(52) U.S. Cl.
CPC ............. *G11C 5/14* (2013.01); *H01L 25/18* (2013.01); *H03K 19/00315* (2013.01); *H03K 19/018521* (2013.01); *H03K 19/09429* (2013.01)

(58) Field of Classification Search
CPC .... G11C 5/14; H01L 25/18; H03K 19/00315; H03K 19/018521; H03K 19/09429; H03K 19/17772
See application file for complete search history.

(56) References Cited

U.S. PATENT DOCUMENTS

| | | | |
|---|---|---|---|
| 6,278,290 B1 | 8/2001 | Young | |
| 6,995,584 B1 | 2/2006 | Nguyen et al. | |
| 8,565,027 B2 * | 10/2013 | Kim | G11C 5/143 365/51 |
| 9,496,042 B1 * | 11/2016 | Abiko | G11C 16/26 |
| 9,509,307 B1 | 11/2016 | Santurkar et al. | |
| 9,680,474 B1 | 6/2017 | Kandala et al. | |
| 2011/0074471 A1 | 3/2011 | Jin et al. | |
| 2011/0084729 A1 | 4/2011 | Yoko | |
| 2013/0070540 A1 * | 3/2013 | Pyeon | G11C 5/147 327/564 |

FOREIGN PATENT DOCUMENTS

DE     102012203043 A1     9/2012

* cited by examiner

*Primary Examiner* — Mohammed A Bashar
(74) *Attorney, Agent, or Firm* — Patterson + Sheridan, LLP

(57) ABSTRACT

Some examples described herein relate to multi-chip devices. In an example, a multi-chip device includes first and second chips. The first chip includes a power supply circuit and a logic circuit. The first and second chips are coupled together. The second chip is configured to receive power from the power supply circuit. The second chip includes a programmable circuit, a pull-up circuit, and a detector circuit. The detector circuit is configured to detect a presence of a power voltage on the second chip and responsively output a presence signal. The power voltage on the second chip is based on the power from the power supply circuit. The logic circuit is configured to generate a pull-up signal based on the presence signal. The pull-up circuit is configured to receive the pull-up signal and configured to pull up a voltage of a node of the programmable circuit responsive to the pull-up signal.

20 Claims, 5 Drawing Sheets

MULTI-CHIP DEVICES

TECHNICAL FIELD

Examples of the present disclosure generally relate to multi-chip devices, and more particularly, to techniques of contention current reduction during power down of multi-chip devices.

BACKGROUND

Apparatuses, including modules and/or packages, that include multiple integrated circuit chips have been developed. The forms of such apparatuses are varied. By forming such apparatuses, an electronic device can integrate multiple chips to form the device, where each chip can be manufactured using standard semiconductor processing to then be assembled and packaged to form a larger, multi-functional device. By having different chips, in some instances, semiconductor processing that is difficult to integrate can be separated, such as when parts of one chip require high temperature processing whereas parts of another chip cannot withstand high temperature processing.

Another aspect is an ability to build a device having chips with different functionalities (for example, some are field programmable gate array (FPGA) chips and some are memory chips) into a same apparatus with a smaller device size and more functionality and lower power. Semiconductor processes for a chip can be more focused to give devices a greater edge in areas such as increased performance of the chip, reduced costs, and increased yield in manufacturing. Other benefits can be realized by such apparatuses.

SUMMARY

Some examples described herein generally relate to multi-chip devices. More particularly, examples described herein relate to techniques of contention current reduction during power down of multi-chip devices.

An example described herein is a multi-chip device. The multi-chip device includes a first chip and a second chip. The first chip includes a power supply circuit and a logic circuit. The second chip is coupled to the first chip. The second chip is configured to receive power from the power supply circuit. The second chip includes a programmable circuit, a pull-up circuit, and a detector circuit. The detector circuit is configured to detect a presence of a power voltage on the second chip and responsively output a presence signal. The power voltage on the second chip is based on the power from the power supply circuit. The logic circuit is configured to generate a pull-up signal based on the presence signal. The pull-up circuit is configured to receive the pull-up signal and configured to pull up a voltage of a node of the programmable circuit responsive to the pull-up signal.

Another example described herein is a method of operating a multi-chip device. A presence signal is generated, by a detector circuit on a first chip, based on detecting a presence of a power voltage on the first chip. The power voltage on the first chip is based on power from a power supply circuit on a second chip. A pull-up signal is generated, by a logic circuit on the second chip, based on the presence signal. A voltage of a node of a programmable circuit on the first chip is pulled up, by a pull-up circuit on the first chip, responsive to the pull-up signal.

Another example described herein is a multi-chip device. The multi-chip device includes a chip stack including a plurality of chips. The plurality of chips includes a first chip and a second chip. The first chip includes a power management module. The power management module includes a power supply circuit and a logic circuit. The power supply circuit is configured to output power. The second chip includes a configurable interconnect network, configuration memory cells, a detector circuit, and a pull-up circuit. Each of the configuration memory cells having a storage node connected to a respective configurable element of the configurable interconnect network. The configuration memory cells are connected to a first power supply node. A first power supply voltage on the first power supply node is based on the power that is output by the power supply circuit. The detector circuit is connected to the first power supply node and configured to detect a presence of the first power supply voltage on the first power supply node and responsively output a presence signal. The logic circuit is connected to the detector circuit and configured to generate a pull-up signal on a pull-up node based on the presence signal. The pull-up circuit is connected to the pull-up node and configured to pull linking nodes of the configurable interconnect network up to a second power supply voltage on a second power supply node in response to the pull-up signal. Each of the linking nodes is connected between two or more of the configurable elements of the configurable interconnect network.

These and other aspects may be understood with reference to the following detailed description.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

Figure 1:
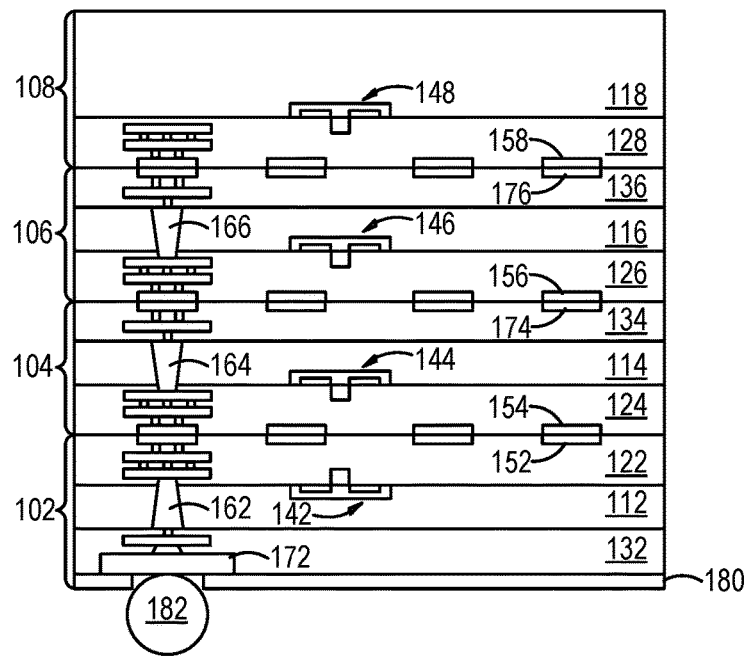
FIG. 1 is a structure of a multi-chip device according to some examples.

Some examples described herein generally relate to multi-chip devices. More particularly, examples described herein relate to techniques of contention current reduction during power down of multi-chip devices.

Generally in some examples, one or more chips of a multi-chip device include a configurable interconnect network (such as may be included in a field gate programmable array (FPGA) or other programmable integrated circuit), configuration memory cells (such as configuration static random access memory (CRAM) cells), a pull-up circuit, and one or more detector circuits. On each of the one or more chips, the configuration memory cells have storage nodes connected to a respective configurable circuit or element of the configurable interconnect network. The configuration memory cells can be written or programmed to configure the configurable circuits or elements of the configurable interconnect network. The configuration memory cells are connected to a memory power supply node for supplying power to the configuration memory cells. The pull-up circuit can include a transistor having source/drains connected to an interconnect power supply node and a node of the configurable interconnect network (e.g., a node connected between two or more configurable circuits or elements). The transistor can have a gate connected to a pull-up node. The pull-up circuit is configured to pull a voltage of the node of the configurable interconnect network up to a voltage of the interconnect power supply. A first detector circuit is connected to the memory power supply node and is configured to detect a presence of a memory power supply voltage on the memory power supply node. A second detector circuit can be connected to the interconnect power supply node and is configured to detect a presence of a interconnect power supply voltage on the interconnect power supply node. The first and second detector circuits can be configured to detect the respective power supply voltages when the respective power supply voltage is above a trip voltage of the chip of the first and second detector circuits. The first and second detector circuits can be configured to output a memory power supply voltage present signal and an interconnect power supply voltage present signal, respectively, which can be a logically low value when the respective power supply voltage is below a trip voltage of the chip, and can be a logically high value when the respective power supply voltage is above a trip voltage of the chip.

Another chip of the multi-chip device includes a power management module that includes a power supply circuit, one or detector circuits, and a logic circuit. The power supply circuit can generate power for one or multiple different power domains that are distributed through the chips of the multi-chip device. In some examples, the power supply circuit generates the interconnect power supply voltage that is applied on the interconnect power supply node and generates the memory power supply voltage that is applied on the memory power supply node. In some examples, the power supply circuit generates the interconnect power supply voltage that is applied on the interconnect power supply node, and generates an intermediate auxiliary power supply voltage from which the memory power supply voltage that is applied on the memory power supply node is generated. The memory power supply voltage can be a regulated voltage generated from the intermediate auxiliary power supply voltage on each of the one or more chips having the configurable interconnect network or on the chip having the power supply circuit. A first detector circuit is connected to, e.g., an intermediate auxiliary power supply node and/or the memory power supply node and is configured to detect a presence of a power supply voltage on the intermediate auxiliary and/or memory power supply node. A second detector circuit can be connected to the interconnect power supply node and is configured to detect a presence of a interconnect power supply voltage on the interconnect power supply node. The first and second detector circuits can be configured to detect the respective power supply voltages when the respective power supply voltage is above a trip voltage of the chip. The first and second detector circuits can be configured to output an intermediate auxiliary and/or memory power supply voltage present signal and an interconnect power supply voltage present signal, respectively, which can be a logically low value when the respective power supply voltage is below a trip voltage of the chip, and can be a logically high value when the respective power supply voltage is above a trip voltage of the chip.

The logic circuit is connected to each of the detector circuits and is configured to receive each of the power supply voltage present signals. The logic circuit is configured to generate a pull-up signal based on one or more of the power supply voltage present signals. For example, the logic circuit can include an AND gate (or similar logic circuit) that ANDs together the power supply voltage present signals (or similar logic function) to generate the pull-up signal. The pull-up signal is output to the pull-up node of the fabric chips. The pull-up circuits of the fabric chips can pull up the respective voltages of the nodes of the configurable interconnect networks to voltages of the interconnect power supply based on the pull-up signal.

As detailed by examples described below, the pull-up signal can be implemented by a complementary interconnect power-on-reset signal, and the logic circuit can be operated during a power down sequence of the multi-chip device. During a power down sequence, the pull-up signal (e.g., complementary interconnect power-on-reset signal) can align nodes of the respective configurable interconnect networks (e.g., by pulling voltages of the nodes up) when any of the chips has reached its trip voltage. By aligning the nodes when any of the chips reaches a trip voltage, contention current in the configurable interconnect networks can be reduced or avoided.

Aspects of these and other examples are described below. Additional or other benefits may be achieved by various examples, as a person having ordinary skill in the art will readily understand upon reading this disclosure. Examples described below are described in the context of a chip stack. Other examples can be implemented in any multi-chip device, such as where each chip is connected by, e.g., minibumps to an interposer. Additionally, although aspects are described in the context of various circuits, other examples can be implemented with or in a number of different programmable circuits (e.g., different programmable integrated circuits). The examples provided herein are simply for clarity of understanding various aspects.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the claimed invention or as a limitation on the scope of the claimed invention. In addition, an illustrated example need not have all the aspects or advantages shown. An aspect or an advantage described in conjunction with a particular example is not necessarily limited to that example and can be practiced in any other examples even if not so illustrated or if not so explicitly described. Further, methods described herein may be described in a particular order of operations, but other methods according to other examples may be implemented in various other orders (e.g., including different serial or parallel performance of various operations) with more or fewer operations.

FIG. 1 is a structure of a multi-chip device according to some examples. The multi-chip device of FIG. 1 includes a chip stack that includes a base chip 102 and fabric chips 104, 106, 108. Various other multi-chip devices can have different structures, different number of chips, additional components, etc. In FIG. 1, the chips 102-108 are stacked and form a chip stack in the multi-chip device. The chips 102-108 are stacked to form, in some examples, an Active die-on-Active die (AoA) device. In some examples, such as described below, more or fewer chips can be included in the chip stack. For example, one or more of the fabric chips 104-108 can be removed from or added into a chip stack.

Each of the chips 102-108 includes a respective semiconductor substrate 112, 114, 116, 118 and respective front side dielectric layer(s) 122, 124, 126, 128 on a front side of the respective semiconductor substrate 112-118. The front side dielectric layer(s) 122-128 include metallization (e.g., metal lines and/or vias) (illustrated but not specifically numbered) formed therein which can electrically connect various components in an integrated circuit. Each of the chips 102-106 includes backside dielectric layer(s) 132, 134, 136 on a backside of the respective semiconductor substrate 112-116. The backside dielectric layer(s) 132-136 include metallization (e.g., metal lines and/or vias) (illustrated but not specifically numbered) formed therein which can electrically connect various components in an integrated circuit. Each semiconductor substrate 112-118 of the chips 102-108 includes, e.g., a transistor 142, 144, 146, 148 formed on and/or in the front side surface of the respective semiconductor substrate 112-118. The transistor 142-148 and any other components can be connected to the metallization in the front side dielectric layer(s) 122-128. Each semiconductor substrate 112-116 of the respective chip 102-106 has backside through-substrate via(s) (TSV(s)) 162, 164, 166 therethrough, which can electrically connect the metallization in the front side dielectric layer(s) 122-126 to the metallization in the backside dielectric layer(s) 132-136 of the respective chip 102-106.

Front side bond pads 152, 154, 156, 158 (e.g., metal (e.g., Cu) bond pads) are formed in the respective front side dielectric layer(s) 122-128 of the chips 102-108 at an exterior surface distal from the respective semiconductor substrate 112-118. The front side bond pads 152-158 can be in an arrangement that forms a respective chip-to-chip interface. The front side bond pads 152-158 are connected to the metallization in the respective front side dielectric layer(s) 122-128. Backside bond pads 174, 176 (e.g., metal (e.g., Cu) bond pads) are formed in the respective backside dielectric layer(s) 134, 136 of the fabric chips 104, 106 at an exterior surface distal from the respective semiconductor substrate 114, 116. The backside bond pads 174, 176 can be in an arrangement that forms a respective chip-to-chip interface. The backside bond pads 174, 176 are connected to the metallization in the respective backside dielectric layer(s) 134, 136.

Exterior connector backside pads 172 (e.g., metal (e.g., aluminum) pads) are formed in the backside dielectric layer(s) 132 of the base chip 102 at an exterior surface distal from the semiconductor substrate 112 of the base chip 102. The exterior connector backside pads 172 are connected to the metallization in the backside dielectric layer(s) 132 of the base chip 102. A passivation layer 180 is formed on the exterior surface distal from the semiconductor substrate 112 of the base chip 102 with respective openings therethrough exposing the exterior connector backside pads 172. External connectors 182 (e.g., controlled collapse chip connections (C4), minibumps, etc.) are formed on respective exterior connector backside pads 172 through the openings in the passivation layer 180.

The external connectors 182 can be attached to a package substrate. The package substrate may further be attached to, e.g., a printed circuit board (PCB) to attach the package substrate (and hence, the multi-chip device) to the PCB. Various other components can be included in a multi-chip device. For example, an interposer, an encapsulant (such as a molding compound (MUF) or the like), etc. can be included in the multi-chip device. A person having ordinary skill in the art will readily envision various modifications that can be made to the multi-chip device.

The chips 102-108 are bonded (e.g., by hybrid bonding using metal-to-metal and oxide-to-oxide bonding) together to form a chip stack. Referring to FIG. 1, the base chip 102 is bonded to the fabric chip 104 front side to front side such that the front side bond pads 152 and exterior surface of the front side dielectric layer(s) 122 of the base chip 102 are bonded to the front side bond pads 154 and exterior surface of the front side dielectric layer(s) 124 of the fabric chip 104. The fabric chip 104 is bonded to the fabric chip 106 backside to front side such that the backside bond pads 174 and exterior surface of the backside dielectric layer(s) 134 of the fabric chip 104 are bonded to the front side bond pads 156 and exterior surface of the front side dielectric layer(s) 126 of the fabric chip 106. The fabric chip 106 is bonded to the fabric chip 108 backside to front side such that the backside bond pads 176 and exterior surface of the backside dielectric layer(s) 136 of the fabric chip 106 are bonded to the front side bond pads 158 and exterior surface of the front side dielectric layer(s) 128 of the fabric chip 108.

Other arrangements of bonding can be implemented. Various permutations of front side to backside, front side to front side, and backside to backside bonding can be implemented. In other examples, the chips 102-108 can be attached together using external connectors (such as minibumps, solder, etc.). In some examples, some of the chips 102-108 can be attached together by external connectors while others of the chips can be bonded together without use of external connectors. Any permutation of bonding and use of external connectors can be implemented.

The chips 102-108, in some examples, are manufactured on different wafers and by different processing. For example, the base chip 102 is manufactured on a base wafer with multiple other base chips, and each fabric chip 104-108 is manufactured on a respective fabric wafer with other fabric chips. As examples, the base wafer can be manufactured with devices (e.g., transistors) having a thick oxide including in gate dielectrics, and the fabric wafers can be manufactured with devices (e.g., transistors) having a thin oxide including in gate dielectrics. The base wafer is bonded to a first fabric wafer, such that the base chip 102 aligns with and is bonded to the fabric chip 104. The first fabric wafer is bonded to a second fabric wafer, such that the fabric chip 104 is bonded to the fabric chip 106. The second fabric wafer is bonded to a third fabric wafer, such that the fabric chip 106 is bonded to the fabric chip 108. The bonding can be performed in any appropriate order.

Since the chips 102-108 are subjected to different processing, the chips can be characterized at different process corner. For example, each strength of n-type transistors and p-type transistors can be characterized, in the aggregate for a given chip, as fast (F), typical (T), and slow (S), such that each chip can be characterized by such strengths. As an example, a chip characterized as "FF" is one where both n-type and p-type transistors (in the aggregate) are fast, or a chip characterized as "TS" is one where n-type transistors (in the aggregate) are typical (or nominal) and p-type transistors (in the aggregate) are slow. Chips characterized at different process corners that are incorporated into a multi-chip device can cause contention current, as described in more detail below.

Figure 2:
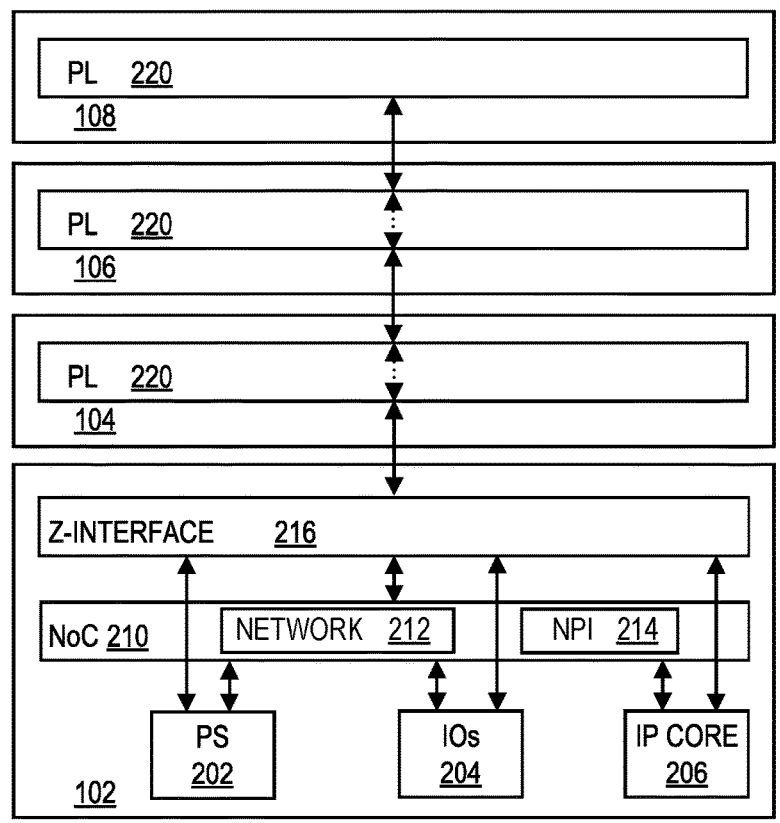
FIG. 2 is a block diagram of a circuit schematic depicting integrated circuits (ICs) of the multi-chip device of FIG. 1 according to some examples.

FIG. 2 is a block diagram of a circuit schematic depicting integrated circuits (ICs) of a chip stack of the multi-chip device of FIG. 1 according to some examples. In the illustrated example, the multi-chip device is a multi-chip programmable device. Various components of the ICs of the chips 102-108 are illustrated in and described with respect to FIG. 1. Other components of the chips 102-108 are illustrated in and described with respect to subsequent figures.

In the illustrated example, the base chip 102 includes a base IC on the base chip 102, which may be a SoC. The fabric chips 104-108 each include a programmable logic (PL) IC 220, which is a same IC. Other ICs (e.g., with other hard IP blocks) can be implemented in the chips. More generally, although the fabric chips 104-108 are illustrated and described as having a PL IC 220, other examples can implement different one or more chips in addition to or instead of the fabric chips 104-108, where such one or more chips has any programmable IC.

The base IC on the base chip 102 includes a processing system 202, input/output circuits (IOs) 204, IP core circuits 206, a Network-on-Chip (NoC) 210, and a Z-interface 216. The processing system 202 may be or include any of a variety of different processor types and number of processor cores. For example, the processing system 202 may be implemented as an individual processor, e.g., a single core capable of executing program instruction code. In another example, the processing system 202 may be implemented as a multi-core processor. The processing system 202 may be implemented using any of a variety of different types of architectures. Example architectures that may be used to implement the processing system 202 may include an ARM processor architecture, an x86 processor architecture, a graphics processing unit (GPU) architecture, a mobile processor architecture, a reduced instruction set computer (RISC) architecture (e.g., RISC-V), or other suitable architecture that is capable of executing computer-readable program instruction code.

The input/output circuits 204 can include eXtreme Performance Input/Output (XPIO), multi-gigabit transceivers (MGTs), high bandwidth memory (HBM) interfaces, Analog-to-Digital Converters (ADC), Digital-to-Analog Converters (DAC), or any other input/output blocks. The input/output circuits 204 can be configured to receive and/or transmit signals from and/or to a circuit outside of the multi-chip device. The IP core circuits 206 can include memory controllers (such as double data rate (DDR) memory controllers, high bandwidth memory (HBM) memory controllers, or the like), peripheral component interconnect express (PCIe) interfaces, cache coherent interconnect for accelerators (CCIX) interfaces, Ethernet cores (such as a media address controller (MAC) or the like), forward error correction (FEC) blocks, and/or any other hardened circuit. Any of the input/output circuits 204 and/or IP core circuits 206 can be programmable.

The NoC 210 includes a programmable network 212 and a NoC peripheral interconnect (NPI) 214. The programmable network 212 communicatively couples subsystems and any other circuits of the base IC on the base chip 102 together. The programmable network 212 includes NoC packet switches and interconnect lines connecting the NoC packet switches. Each NoC packet switch performs switching of NoC packets in the programmable network 212. The programmable network 212 has interface circuits at the edges of the programmable network 212. The interface circuits include NoC master units (NMUs) and NoC slave units (NSUs). Each NMU is an ingress circuit that connects a master circuit to the programmable network 212, and each NSU is an egress circuit that connects the programmable network 212 to a slave endpoint circuit. NMUs are communicatively coupled to NSUs via the NoC packet switches and interconnect lines of the programmable network 212. The NoC packet switches are connected to each other and to the NMUs and NSUs through the interconnect lines to implement a plurality of physical channels in the programmable network 212. The NoC packet switches, NMUs, and NSUs include register blocks that determine the operation of the respective NoC packet switch, NMU, or NSU.

The NPI 214 includes circuitry to write to register blocks that determine the functionality of the NMUs, NSUs, and NoC packet switches. The NPI 214 includes a peripheral interconnect coupled to the register blocks for programming thereof to set functionality. The register blocks in the NMUs, NSUs, and NoC packet switches of the programmable network 212 support interrupts, quality of service (QoS), error handling and reporting, transaction control, power management, and address mapping control. The NPI 214 can include an NPI root node residing on the processing system 202 (e.g., a platform management controller (PMC) of the processing system 202), interconnected NPI switches connected to the NPI root node, and protocol blocks connected to the interconnected NPI switches and a corresponding register block. The NPI 214 may be used to program any programmable circuit of the base IC on the base chip 102. For example, the NPI 214 may be used to program any input/output circuit 204 and/or IP core circuit 206 that is programmable.

The Z-interface 216 can be a passive interconnect or can include active circuits, such as buffers to drive signals. The Z-interface 216 provides an interface, including via metal lines and vias in metallization layers, for the processing system 202, input/output circuits 204, IP core circuits 206, and programmable network 212 of the NoC 210 to chips overlying the base chip 102.

The various subsystems and circuits of the base IC on the base chip 102 can be communicatively coupled. As illustrated, the processing system 202, input/output circuits 204, and IP core circuits 206 are connected to the NoC 210 (e.g., to the programmable network 212), and hence, are communicatively coupled to each other. The processing system 202 is further connected to the NPI 214 for communicating configuration data to various programmable components on the base chip 102. The processing system 202 is further connected to the programmable network 212 of the NoC 210 for communicating configuration data to chips overlying the base chip 102. The programmable network 212 of the NoC 210 is connected to the Z-interface 216 such that data, such as transactional data and configuration data, can be communicated through the Z-interface 216 to another chip. Each of the processing system 202, input/output circuits 204, and IP core circuits 206 is connected to the Z-interface 216 for direct communications with, e.g., programmable logic in the PL ICs 220 in overlying fabric chips 104-108. Other communication mechanisms, such as direct connections, between the various subsystems and circuits may be implemented.

The PL IC 220 on each of the fabric chips 104-108 includes one or more programmable logic region. The programmable logic region is logic circuitry that may be programmed to perform specified functions. The programmable logic region can include any number or arrangement of programmable tiles. As an example, the programmable logic region may be implemented as fabric of an FPGA. For example, the programmable logic region can include any number of configurable logic blocks (CLBs), look-up tables (LUTs), digital signal processing blocks (DSPs), random access memory blocks (BRAMs), etc. Each of the programmable tiles (e.g., CLBs, LUTs, DSPs, BRAMs, etc.) can include one or more programmable interconnect elements. The various respective types of programmable tiles can be arranged in rows and/or columns, and the associate programmable interconnect elements can be connected to neighboring programmable logic elements in a same column and row, for example. The programmable interconnect elements can be interconnected to form a configurable interconnect network of the programmable logic region. Any logic and connections can be implemented by the programmable logic region by programming or configuring any of the programmable tiles of the programmable logic region.

Each PL IC 220 can also include a configuration interconnect that includes a configuration Frame (CFRAME) driver. The CFRAME driver may be or include control logic to communicate configuration data (such as a bitstream) to configure programmable logic. Each programmable logic region is configurable or programmable by configuration data received via the Z-interface 216. For example, the processing system 202 (e.g., a PMC of the processing system 202) can transmit configuration data via the programmable network 212 of the NoC 210 and the Z-interface 216 to a respective PL IC 220. In some examples, a configuration interconnect (e.g., including a CFRAME driver) can direct the configuration data to appropriate programmable tiles and can control configuring such programmable tiles.

The PL ICs 220 and/or the fabric chips 104-108 can include communication paths to transmit signals between underlying and overlying chips. For example, the communication paths can be passive communication paths, such as metallizations and TSVs through a given chip. In some examples, active circuitry can be included in a communication path, such as a buffer or driver. In some examples, active circuitry can be programmable to configure, e.g., directionality of communication of signals, such as by tri-state buffers.

In various circuits that are described below, reference identifiers may be made to a node and/or a signal on that node. A person of ordinary skill will readily understand such interchangeability of reference identifiers and will understand from context whether such reference identifier refers to a node or a signal. Additionally, reference to a low signal or a high signal refers to signals having a logically low value or a logically high value, respectively.

Figure 3:
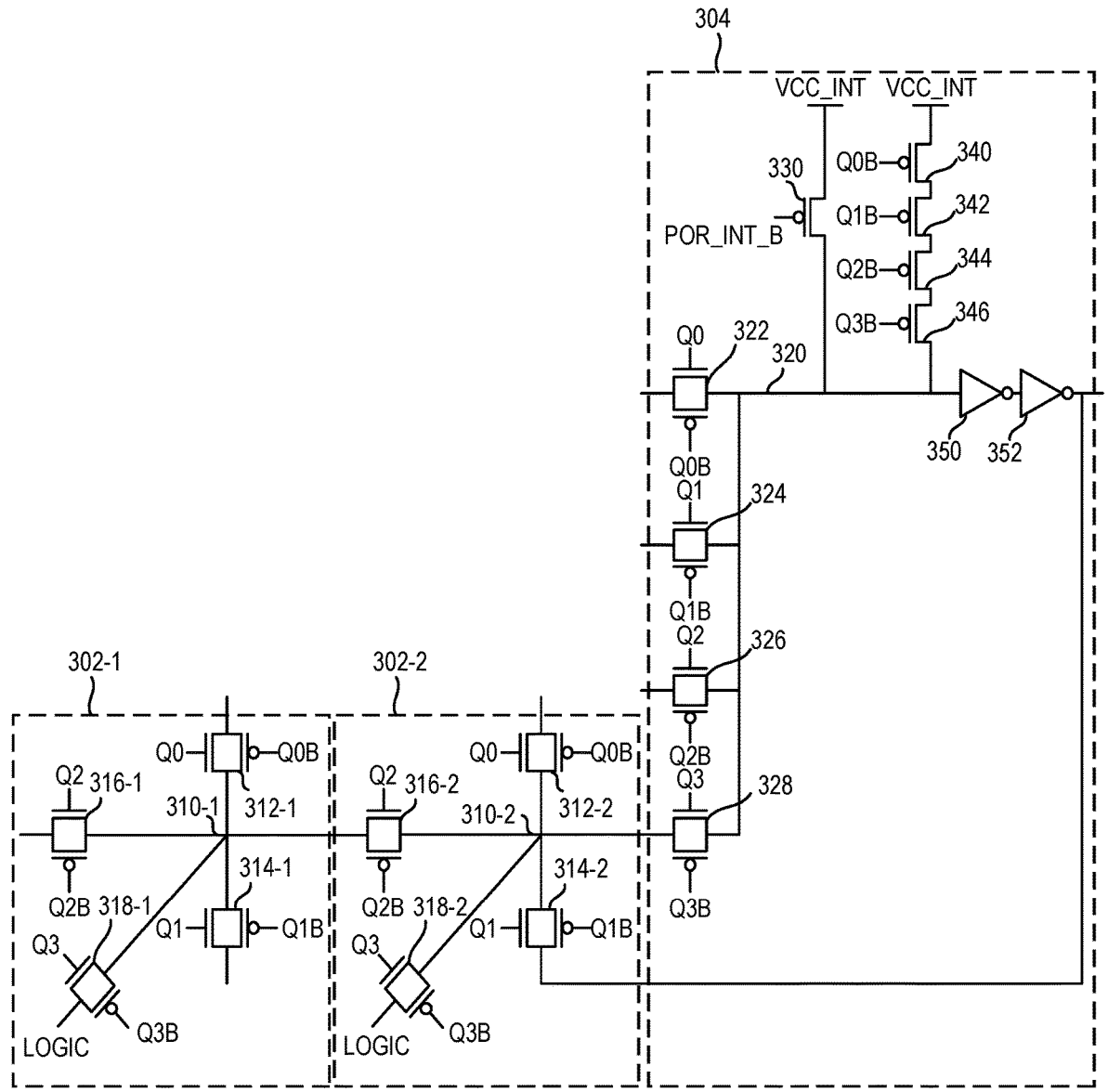
FIG. 3 is a simplified circuit diagram of configurable interconnect elements of a configurable interconnect network according to some examples.

FIG. 3 is a simplified circuit diagram of configurable interconnect elements of a configurable interconnect network (e.g., for each of the PL ICs 220) according to some examples. The configurable interconnect network may be a programmable circuit or included in a programmable circuit, such as a FPGA, a complex programmable logic device (CPLD), a programmable logic array (PLA), or the like. The configurable interconnect network is described as being part of the PL IC 220 described above, which may be or include a FPGA. FIG. 3 shows a first interconnect node 302-1, a second interconnect node 302-2, and a multiplexer node 304. The circuits within the first interconnect node 302-1 and the second interconnect node 302-2 are generally the same, and hence, a generic interconnect node is described here. Components generically described but having a "-1" appended to the reference number in the illustration (or described below) are for the first interconnect node 302-1, and components having a "-2" appended to the reference number in the illustration (or described below) are for the second interconnect node 302-2. The first interconnect node 302-1 and the second interconnect node 302-2 are generically referred to, either individually or collectively, as interconnect node(s) 302.

The interconnect node 302 includes transmission gates 312, 314, 316, 318. Each transmission gate 312-318 includes a parallel connected n-type transistor and p-type transistor. Each transmission gate 312-318 has an input/output node connected to a linking node 310. Each transmission gate 312-316 further has another input/output node connected to a node of another (e.g., neighboring) interconnect node 302 or multiplexer node 304. The transmission gate 318 has another input/output node connected to a logic node LOGIC of a programmable logic element, such as a configurable logic element (CLE), BRAM logic element (BRL), DSP logic element (DSPL), or input/output logic element (IOL). The gates of each of the transmission gates 312-318 are connected to complementary storage nodes of a respective configuration static random access memory (CRAM) cell of the interconnect node 302. The gate of the n-type transistor of the transmission gate 312 is connected to a storage node Q0 of a CRAM cell C0, and the gate of the p-type transistor of the transmission gate 312 is connected to a complementary storage node Q0B of a CRAM cell C0. The gate of the n-type transistor of the transmission gate 314 is connected to a storage node Q1 of a CRAM cell C1, and the gate of the p-type transistor of the transmission gate 314 is connected to a complementary storage node Q1B of a CRAM cell C1. The gate of the n-type transistor of the transmission gate 316 is connected to a storage node Q2 of a CRAM cell C2, and the gate of the p-type transistor of the transmission gate 316 is connected to a complementary storage node Q2B of a CRAM cell C2. The gate of the n-type transistor of the transmission gate 318 is connected to a storage node Q3 of a CRAM cell C3, and the gate of the p-type transistor of the transmission gate 318 is connected to a complementary storage node Q3B of a CRAM cell C3.

The multiplexer node 304 includes transmission gates 322, 324, 326, 328, p-type transistors 330, 340, 342, 344, 346, and inverters 350, 352. Each transmission gate 312-318 includes a parallel connected n-type transistor and p-type transistor. Each transmission gate 322-328 has an input/output node connected to a linking node 320. Each transmission gate 322-328 further has another input/output node connected to a node of another (e.g., neighboring) interconnect node 302 or multiplexer node 304. The gates of each of the transmission gates 322-328 are connected to complementary storage nodes of a respective CRAM cell of the multiplexer node 304. The gate of the n-type transistor of the transmission gate 322 is connected to a storage node Q0 of a CRAM cell C0, and the gate of the p-type transistor of the transmission gate 322 is connected to a complementary storage node Q0B of a CRAM cell C0. The gate of the n-type transistor of the transmission gate 324 is connected to a storage node Q1 of a CRAM cell C1, and the gate of the p-type transistor of the transmission gate 324 is connected to a complementary storage node Q1B of a CRAM cell C1. The gate of the n-type transistor of the transmission gate 326 is connected to a storage node Q2 of a CRAM cell C2, and the gate of the p-type transistor of the transmission gate 326 is connected to a complementary storage node Q2B of a CRAM cell C2. The gate of the n-type transistor of the transmission gate 328 is connected to a storage node Q3 of a CRAM cell C3, and the gate of the p-type transistor of the transmission gate 328 is connected to a complementary storage node Q3B of a CRAM cell C3.

A source of the p-type transistor 330 is connected to an interconnect power supply node VCC_INT, and a drain of the p-type transistor 330 is connected to the linking node 320. A gate of the p-type transistor 330 is connected to a complementary interconnect power-on-reset node POR_INT_B. The p-type transistors 340-346 are serially connected. A source of the p-type transistor 340 is connected to the interconnect power supply node VCC_INT. A drain of the p-type transistor 340 is connected to a source of the p-type transistor 342. A drain of the p-type transistor 342 is connected to a source of the p-type transistor 344. A drain of the p-type transistor 344 is connected to a source of the p-type transistor 346. A drain of the p-type transistor 346 is connected to the linking node 320. Respective gates of the p-type transistors 340-346 are connected to complementary storage nodes Q0B-Q3B of the CRAM cells C0-C3 of the multiplexer node 304. The inverters 350, 352 are serially connected. An input node of the inverter 350 is connected to the linking node 320, and an output node of the inverter 350 is connected to an input node of the inverter 352.

The interconnect nodes 302 and multiplexer node 304 are shown to illustrate aspects of examples herein. Many interconnect nodes 302 are generally included in the configurable interconnect network of a PL IC. A connection between the linking node 310-1 of the first interconnect node 302-1 to an input/output node of the transmission gate 316-2 of the second interconnect node 302-2 is illustrative of the many connections that can be implemented between neighboring interconnect nodes 302. A number of multiplexer nodes 304 can be interleaved within the interconnect nodes 302 in the configurable interconnect network. The multiplexer nodes 304 can be connected to neighboring interconnect nodes 302, like shown by the connection between the linking node 310-2 of the second interconnect node 302-2 and an input/output node of the transmission gate 328. Further, the multiplexer nodes 304 can be connected to provide feedback to interconnect nodes 302, like shown by the connection between the output node of the inverter 352 of the multiplexer node 304 and an input/output node of the transmission gate 314-2 of the second interconnect node 302-2. Many details of the various interconnect nodes 302 and multiplexer nodes 304 have been omitted for simplicity and clarity.

Figure 4:
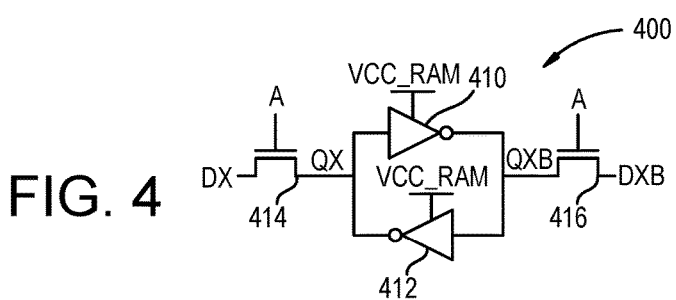
FIG. 4 illustrates an example configuration static random access memory (CRAM) cell according to some examples.

FIG. 4 illustrates an example CRAM cell 400. The CRAM cell 400 is illustrative of the CRAM cells of the interconnect nodes 302 and multiplexer nodes 304. The CRAM cell 400 includes cross-coupled inverters 410, 412 and pass-gate transistors 414, 416. An input node of the inverter 410 and an output node of the inverter 412 are connected together and form a storage node QX. An output node of the inverter 410 and an input node of the inverter 412 are connected together and form a complementary storage node QXB. The inverters 410, 412 are connected to a CRAM power supply node VCC_RAM for power.

A source/drain of the pass-gate transistor 414 is connected to a data line node DX, and another source/drain of the pass-gate transistor 414 is connected to the storage node QX. A source/drain of the pass-gate transistor 416 is connected to a complementary data line node DXB, and another source/drain of the pass-gate transistor 416 is connected to the complementary storage node QXB. Gates of the pass-gate transistors 414, 416 are connected to an address node A.

A complementary interconnect power-on-reset signal POR_INT_B can be generated on the base chip 102 (e.g., by a power management module (PMM)). This complementary interconnect power-on-reset signal POR_INT_B is then propagated through from the base chip 102 to the fabric chips 104-108 and is distributed to the complementary interconnect power-on-reset nodes POR_INT_B of multiplexer nodes 304 in the configurable interconnect network. The complementary interconnect power-on-reset signal POR_INT_B can cause linking nodes 310 (by feedback) and 320 to be pulled up to an interconnect power supply voltage VCC_INT when the complementary interconnect power-on-reset signal POR_INT_B is low during power up and power down sequences. For example, a low complementary interconnect power-on-reset signal POR_INT_B can cause the p-type transistor 330 to become closed or in a conducting state such that the linking node 320 is pulled up to the interconnect power supply voltage VCC_INT, which can be fed back to other linking nodes 310 via the inverters 350, 352. Accordingly, the p-type transistor 330 can be referred to as a pull-up circuit. Other pull-up circuits can be implemented.

By pulling the linking nodes 310, 320 up to the interconnect power supply voltage VCC_INT, voltage drops between linking nodes 310, 320, which can cause high contention current through a connecting transmission gate, can be reduced or eliminated. For example, without pulling the linking nodes 310, 320 up to the interconnect power supply voltage VCC_INT, the contention current can occur when (i) the logic nodes LOGIC to which the interconnect nodes 302 are connected are at different voltages and (ii) the CRAM power supply node VCC_RAM drops during a power down sequence below a trip voltage of the respective chip such that the signals of complementary storage nodes QXB become sufficiently low that the p-type transistors of transmission gates are in a conducting state.

If the complementary interconnect power-on-reset signal POR_INT_B is generated solely based on conditions detected on the base chip 102, in some circumstances, the complementary interconnect power-on-reset signal POR_INT_B may not be low at a time when the linking nodes 310, 320 should be pulled up to the interconnect power supply voltage VCC_INT. Generally, this can occur when the base chip 102 is characterized at a faster process corner than any of the fabric chips 104-108.

Figure 5:
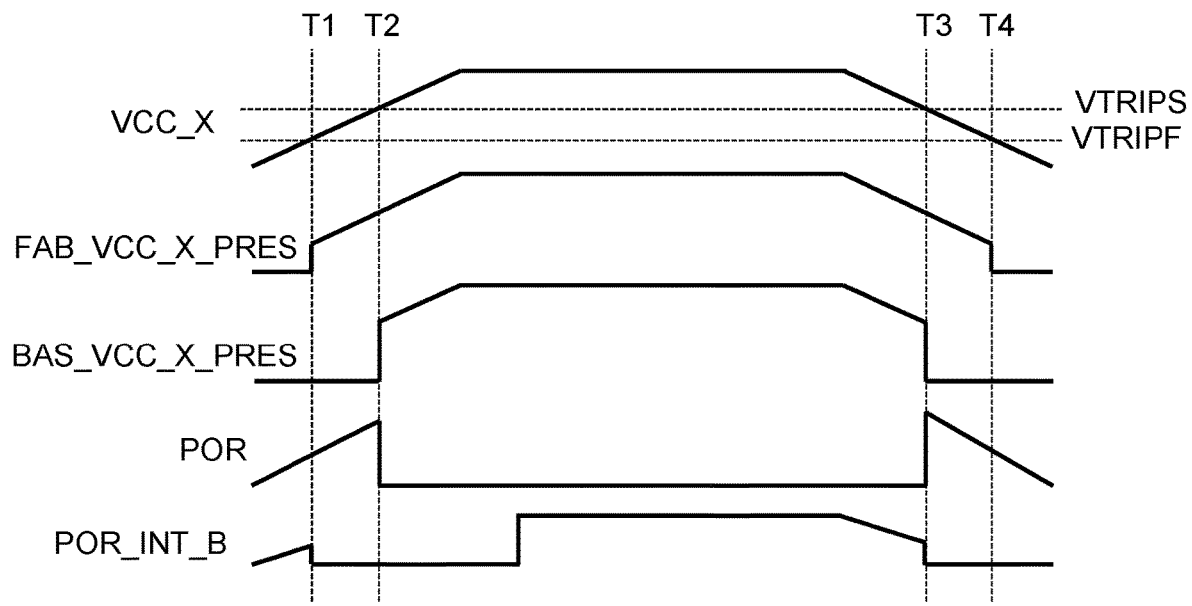
FIGS. 5 and 6 are charts illustrating signals and timing when a base chip and a fabric chip are characterized at different process corners.
Figure 6:
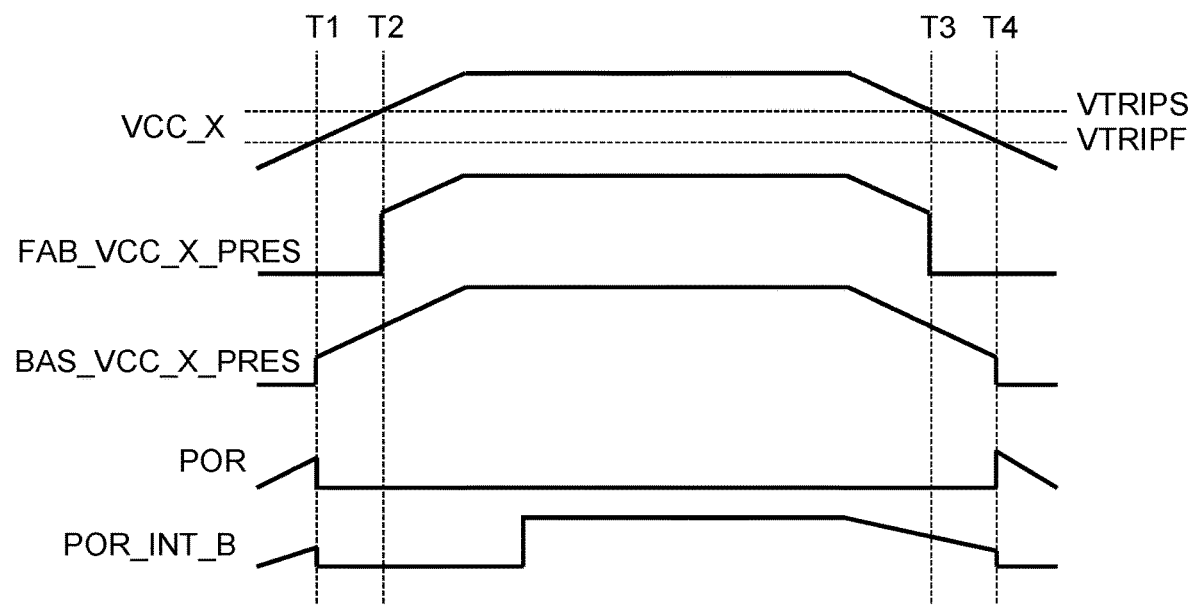

FIGS. 5 and 6 are charts illustrating signals and timing when a base chip and any fabric chip are characterized at different process corners. In FIG. 5, the base chip is characterized as slow-slow (SS), and the fabric chip is characterized as fast-fast (FF). In FIG. 6, the base chip is characterized as fast-fast (FF), and the fabric chip is characterized as slow-slow (SS). In these examples, the power-on-reset signal POR and the complementary interconnect power-on-reset signal POR_INT_B are generated solely based on conditions detected on the base chip.

Both FIGS. 5 and 6 illustrate a power supply voltage VCC rising during a power up sequence and falling during a power down sequence. As the power supply voltage VCC rises during power up, it passes a fast trip voltage VTRIPF (e.g., 0.25 V) at time T1 and, subsequently, a slow trip voltage VTRIPS (e.g., 0.53 V) at time T2. As the power supply voltage VCC falls during power down, it passes the slow trip voltage VTRIPS at time T3 and, subsequently, a fast trip voltage VTRIPF at time T4. Generally, transistors of chips that are classified as fast have a lower threshold voltage $v_t$ than transistors of chips that are classified as slow. Accordingly, chips that are classified as fast will trip on to become operational at a lower voltage on power up, and will trip off at a lower voltage on power down. Conversely, chips that are classified as slow will trip on to become operational at a higher voltage on power up, and will trip off at a higher voltage on power down.

FIGS. 5 and 6 show a base chip generic power supply voltage present signal BAS_VCC_X_PRES during the power up and power down sequences when the base chip is characterized as slow-slow (SS) and fast-fast (FF), respectively. The base chip generic power supply voltage present signal BAS_VCC_X_PRES is generic to any power supply voltage on the base chip, and is generally used to illustrate aspects of power up and power down sequences. In FIG. 5, the base chip generic power supply voltage present signal BAS_VCC_X_PRES indicates that the power supply voltage VCC is high enough to trip on the base chip during power up at time T2, and that the power supply voltage VCC is low enough to trip off the base chip during power down at time T3. The base chip in FIG. 5 trips on/off at the higher slow trip voltage VTRIPS since the base chip is characterized as slow-slow. In FIG. 6, the base chip generic power supply voltage present signal BAS_VCC_X_PRES indicates that the power supply voltage VCC is high enough to trip on the base chip during power up at time T1, and that the power supply voltage VCC is low enough to trip off the base chip during power down at time T4. The base chip in FIG. 6 trips on/off at the lower fast trip voltage VTRIPF since the base chip is characterized as fast-fast.

FIGS. 5 and 6 show a fabric chip generic power supply voltage present signal FAB_VCC_X_PRES during the power up and power down sequences when the fabric chip is characterized as fast-fast (FF) and slow-slow (SS), respectively. The fabric chip generic power supply voltage present signal FAB_VCC_X_PRES is generic to any power supply voltage on a fabric chip, and is generally used to illustrate aspects of power up and power down sequences. In FIG. 5, the fabric chip generic power supply voltage present signal FAB_VCC_X_PRES indicates that the power supply voltage VCC is high enough to trip on the fabric chip during power up at time T1, and that the power supply voltage VCC is low enough to trip off the fabric chip during power down at time T4. The fabric chip in FIG. 5 trips on/off at the lower fast trip voltage VTRIPF since the fabric chip is characterized as fast-fast. In FIG. 6, the fabric chip generic power supply voltage present signal FAB_VCC_X_PRES indicates that the power supply voltage VCC is high enough to trip on the fabric chip during power up at time T2, and that the power supply voltage VCC is low enough to trip off the fabric chip during power down at time T3. The fabric chip in FIG. 6 trips on/off at the higher slow trip voltage VTRIPS since the fabric chip is characterized as slow-slow.

FIGS. 5 and 6 also show the power-on-reset signal POR. The power-on-reset signal POR is, in these figures, detected and/or generated only at the base chip. The power-on-reset signal POR generally tracks the power supply voltage VCC until the power supply voltage VCC is above the trip voltage of the base chip, at which point the power-on-reset signal POR is low. As shown in FIG. 5, the power-on-reset signal POR tracks the power supply voltage VCC up to time T2 when the base chip trips on (as indicated by the base chip generic power supply voltage present signal BAS_VCC_X_PRES), remains low from time T2 to time T3, and at time T3, transitions to track the power supply voltage VCC as the base chip trips off (as indicated by the base chip generic power supply voltage present signal BAS_VCC_X_PRES). As shown in FIG. 6, the power-on-reset signal POR tracks the power supply voltage VCC up to time T1 when the base chip trips on (as indicated by the base chip generic power supply voltage present signal BAS_VCC_X_PRES), remains low from time T1 to time T4, and at time T4, transitions to track the power supply voltage VCC as the base chip trips off (as indicated by the base chip generic power supply voltage present signal BAS_VCC_X_PRES).

FIGS. 5 and 6 further show the complementary interconnect power-on-reset signal POR_INT_B. During a power up sequence, the complementary interconnect power-on-reset signal POR_INT_B is generated based on a specified sequencing of a state machine that controls the sequence of bringing different power domains up to a power supply voltage. The complementary interconnect power-on-reset signal POR_INT_B is generally low during this power up sequence. Assuming that the complementary interconnect power-on-reset signal POR_INT_B is provided at the complementary interconnect power-on-reset node POR_INT_B in FIG. 3, when the complementary interconnect power-on-reset signal POR_INT_B is low, the linking nodes 310, 320 in the configurable interconnect network are pulled up to the voltage of the interconnect power supply node VCC_INT. At the conclusion of the power up sequence, the complementary interconnect power-on-reset signal POR_INT_B is released and transitions to high (between time T2 and time T3). Generally, the timing of the power up sequence can dictate the timing of the transition of the complementary interconnect power-on-reset signal POR_INT_B between time T2 and time T3.

In FIGS. 5 and 6, during a power down sequence, the complementary interconnect power-on-reset signal POR_INT_B tracks the base chip generic power supply voltage present signal BAS_VCC_X_PRES. Accordingly, in FIG. 5, the complementary interconnect power-on-reset signal POR_INT_B transitions to low at time T3 (e.g., when the base chip trips off during power down), and in FIG. 6, the complementary interconnect power-on-reset signal POR_INT_B transitions to low at time T4 (e.g., when the base chip trips off during power down).

In the situation presented by FIG. 5, a high contention current in the configurable interconnect network may not occur. It is noted that immediately prior to powering down, it is assumed that the configurable interconnect network is configured to be operational (e.g., according to a user design) without contention current being present in the configurable interconnect network. Since the fabric chip is characterized as fast-fast and its transistors generally have a lower threshold voltage, the interconnect chip can retain its operational status and configuration after time T3, at which point the base chip generates a low complementary interconnect power-on-reset signal POR_INT_B. The low complementary interconnect power-on-reset signal POR_INT_B at time T3 in FIG. 5 causes linking nodes 310, 320 in the configurable interconnect network to be pulled up to the voltage of the interconnect power supply node VCC_INT by the transistors 330 and feedback, which prevents or reduces voltage drops between different linking nodes 310, 320. With reduced or no voltage drop between different linking nodes 310, 320, a high contention current through a transmission gate connected between those linking nodes can be avoided.

In the situation presented by FIG. 6, a high contention current in the configurable interconnect network may occur. In this situation, the configurable interconnect network of the fabric chip can lose its configuration before the complementary interconnect power-on-reset signal POR_INT_B transitions to low. Because the base chip is characterized as fast-fast and its transistors generally have a lower threshold voltage, the base chip does not transition the complementary interconnect power-on-reset signal POR_INT_B to low until the power supply voltage VCC is at the lower fast trip voltage VTRIPF at time T4. However, because the fabric chip is characterized as slow-slow and its transistors generally have a higher threshold voltage, the signals on complementary storage nodes QX, QXB of CRAM cells can fall to voltage levels below the threshold voltages of transistors of corresponding transmission gates at and subsequent to time T3 (and hence, the fabric chip tripping off at time T3 as indicated by the fabric chip generic power supply voltage present signal FAB_VCC_X_PRES). When the signals on the complementary storage nodes QX, QXB fall to voltage levels below the threshold voltages of transistors of transmission gates, the p-type transistors of the transmission gates can be in a conducting state. If voltages at logic nodes LOGIC connected to transmission gate 318 of the interconnect nodes 302 differ (e.g., due to a persistent voltage from the preceding configuration of the programmable logic element), voltage drops may be present between nodes between which one or more transmission gates are connected. The voltage drops can result in high contention current flowing through the intervening transmission gate(s), which can burn out those transmission gate(s) and damage the fabric chip. The possibility of this contention current occurring is present between time T3 when the complementary interconnect power-on-reset signal POR_INT_B is high and time T4 when the complementary interconnect power-on-reset signal POR_INT_B transitions to low and the linking nodes 310, 310 are pulled up by p-type transistors 330.

Figure 7:
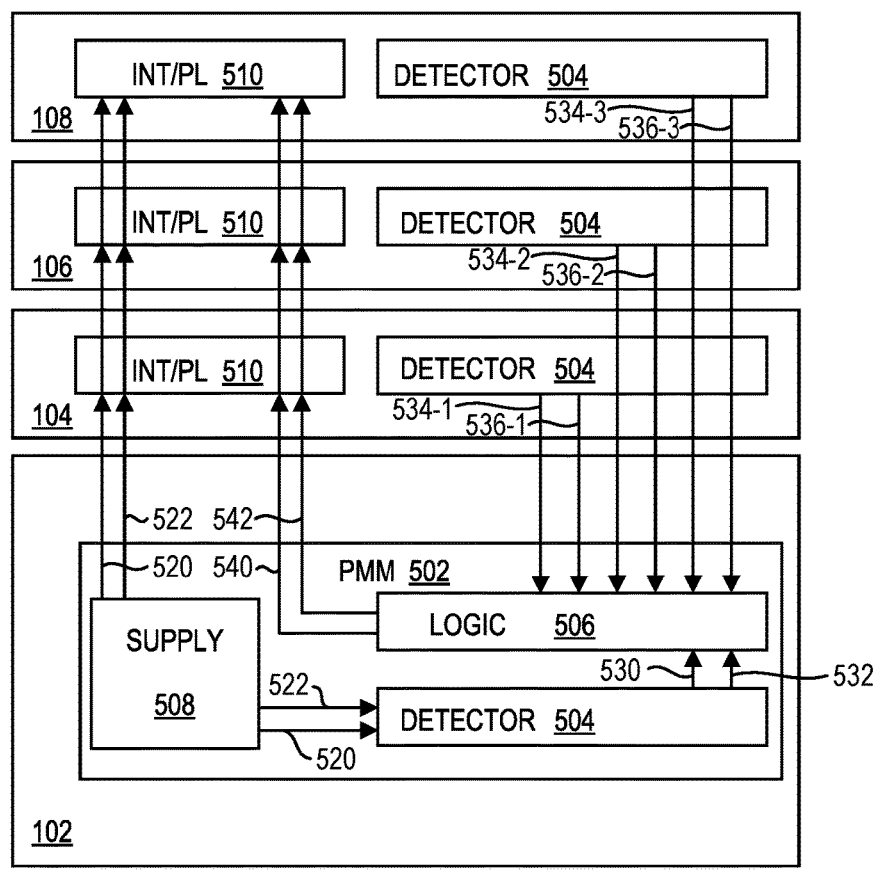
FIG. 7 is a block diagram of a circuit schematic depicting additional details of the ICs of the multi-chip device of FIG. 2 according to some examples.

FIG. 7 is a block diagram of a circuit schematic depicting additional details of the ICs of the chip stack of the multi-chip device of FIG. 2 according to some examples. The base chip 102 includes a power management module (PMM) 502. The PMM 502 can be included in the processing system 202 in some examples and can be outside of the processing system in other examples. The PMM 502 includes a detector circuit 504, logic circuit 506, and a power supply circuit 508. The PL ICs 220 of the fabric chips 104-108 each include a detector circuit 504 and an interconnect network and programmable logic (INT/PL) 510 (e.g., fabric).

The power supply circuit 508 is configured to output power to the chips 102-108. The power supply circuit 508 is further configured to generate and regulate power voltages of one or more power domains of the chip stack. The power supply circuit 508 distributes that power throughout the chip stack through metal layers and/or TSVs in the various chips 102-108. FIG. 7 shows the power supply circuit 508 being connected to the INT/PL 510 of the fabric chips 104-108 and the detector circuit 504 in the PMM 502 via a first power supply node 520 and a second power supply node 522. In some examples, the power supply circuit 508 can distribute an interconnect power supply voltage VCC_INT on the first power supply node 520 and a CRAM power supply voltage VCC_RAM on the second power supply node 522. In such examples, the first power supply node 520 can be an interconnect power supply node VCC_INT, and the second power supply node 522 can be a CRAM power supply node VCC_RAM. In other examples, the power supply circuit 508 can distribute an interconnect power supply voltage VCC_INT on the first power supply node 520 and an auxiliary power supply voltage VCC_AUX on the second power supply node 522. In such examples, the first power supply node 520 can be an interconnect power supply node VCC_INT, and the second power supply node 522 can be an auxiliary power supply node VCC_AUX. Each of the fabric chips 104-108 can include a power conversion circuit to generate a regulated CRAM power supply voltage VCC_RAM from the auxiliary power supply voltage VCC_AUX and to distribute the CRAM power supply voltage VCC_RAM on a CRAM power supply node VCC_RAM on the respective fabric chip 104-108. When powered up and operational, the CRAM power supply voltage VCC_RAM can be greater than the interconnect power supply voltage VCC_INT and/or the auxiliary power supply voltage VCC_AUX. The interconnect power supply node VCC_INT and the CRAM power supply node VCC_RAM are connected to the configurable interconnect network of the INT/PL 510, such as shown in FIGS. 3 and 4.

The detector circuit 504 on each fabric chip 104-108 is connected to the interconnect power supply node VCC_INT and the CRAM power supply node VCC_RAM on that respective chip 102-108 to detect when the interconnect power supply voltage VCC_INT and the CRAM power supply voltage VCC_RAM are sufficiently high for the respective fabric chip 104-108 to be operational. The detector circuit 504 on the base chip 102 is connected to the first power supply node 520 (e.g., the interconnect power supply node VCC_INT) and the second power supply node 522 (e.g., the CRAM power supply node VCC_RAM or the auxiliary power supply node VCC_AUX). The detector circuit 504 detects when the respective chip 102-108 trips on and trips off. The detector circuit 504 of the base chip 102 is connected to the logic circuit 506 via first power supply voltage present node VCC_X_PRES 530 and second power supply voltage present node VCC_X_PRES 532. Each detector circuit 504 of the fabric chips 104-108 is connected to the logic circuit 506 of the PMM 502 via respective interconnect power supply voltage present nodes VCC_INT_PRES 534-1, 534-2, 534-3 and respective CRAM power supply voltage present nodes VCC_RAM_PRES 536-1, 536-2, 536-3. The detector circuit 504 of the base chip 102 outputs a respective first power supply voltage present signal VCC_X_PRES and second power supply voltage present signal VCC_X_PRES on the first power supply voltage present node VCC_X_PRES 530 and the second power supply voltage present node VCC_X_PRES 532, respectively. Each detector circuit 504 of the fabric chips 104-108 outputs a respective interconnect power supply voltage present signal VCC_INT_PRES and CRAM power supply voltage present signal VCC_RAM_PRES on the interconnect power supply voltage present node VCC_INT_PRES 534-1, 534-2, 534-3 and a CRAM power supply voltage present node VCC_RAM_PRES 536-1, 536-2, 536-3, respectively.

The logic circuit 506 is connected to each power supply voltage present node 530, 532, 534, 536. The logic circuit 506 can include a NAND gate or similar logic circuit to NAND the power supply voltage present signals VCC_X_PRES, VCC_INT_PRES, VCC_RAM_PRES generated on the chips 102-108 to generate a global power-on-reset signal POR. The global power-on-reset signal POR is output by the logic circuit 506 on a global power-on-reset node POR 540, which is connected to each INT/PL 510 of the fabric chips 104-108. The logic circuit 506 can further include a logic state machine that is configured to implement a power up sequence and/or a power down sequence. In the power up sequence, the logic state machine can generate a global complementary interconnect power-on-reset signal POR_INT_B based on the global power-on-reset signal POR and any condition of the state machine. In the power down sequence, the logic state machine can generate the global complementary interconnect power-on-reset signal POR_INT_B by inverting the global power-on-reset signal POR. In some examples, the logic circuit can include an AND gate or similar logic circuit to AND the power supply voltage present signals VCC_X_PRES, VCC_INT_PRES, VCC_RAM_PRES generated on the chips 102-108 to generate the global complementary interconnect power-on-reset signal POR_INT_B. The global complementary interconnect power-on-reset signal POR_INT_B is output by the logic circuit 506 on a global complementary interconnect power-on-reset node POR_INT_B 542, which is connected to each INT/PL 510 of the fabric chips 104-108. The complementary interconnect power-on-reset node POR_INT_B 542 is connected to gates of p-type transistors 330 in multiplexer nodes 304 in the configurable interconnect networks of the INT/PL 510. Hence, the pull-up circuits of the configurable interconnect networks can pull voltages of linking nodes 310, 320 up in response to the complementary interconnect power-on-reset signal POR_INT_B on the global complementary interconnect power-on-reset node POR_INT_B 542.

Figure 8:
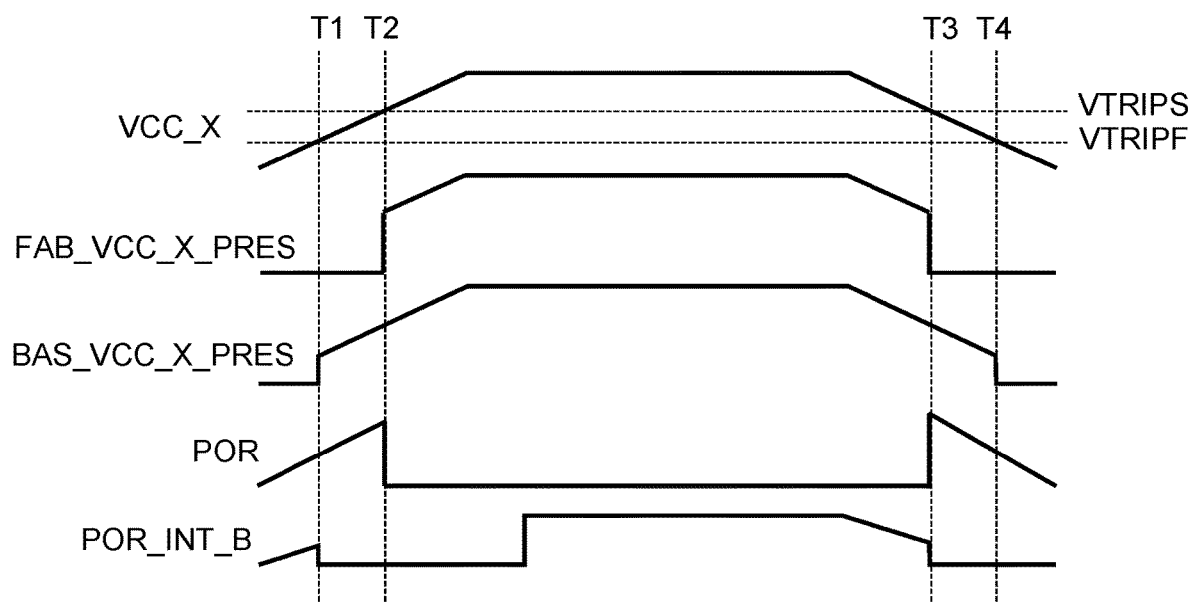
FIG. 8 is a chart illustrating signals and timing when a base chip and a fabric chip are characterized as fast-fast (FF) and slow-slow (SS) in the context of the circuit diagram of FIG. 7 according to some examples.

FIG. 8 is a chart illustrating signals and timing when a base chip and a fabric chip are characterized as fast-fast (FF) and slow-slow (SS) in the context of the circuit diagram of FIG. 7 according to some examples. In the chart of FIG. 8, the fabric chip generic power supply voltage present signal FAB_VCC_X_PRES is illustrative of any of the interconnect power supply voltage present signals VCC_INT_PRES and/or CRAM power supply voltage present signals VCC_RAM_PRES generated by any fabric chip 104-108, and the base chip generic power supply voltage present signal BAS_VCC_X_PRES is illustrative of any of the first and second power supply voltage present signals VCC_X_PRES generated by the base chip 102. As shown in FIG. 8, in a power down sequence, the global power-on-reset signal POR has transitions aligned with the slowest chip, which is the fabric chip as illustrated by the fabric chip generic power supply voltage present signal FAB_VCC_X_PRES tripping at the slow trip voltage VTRIPS. The power-on-reset signal POR is generated by NANDing the fabric chip generic power supply voltage present signal FAB_VCC_X_PRES and the base chip generic power supply voltage present signal BAS_VCC_X_PRES to align the power-on-reset signal POR to the slowest chip. Further, in the power down sequence, the global complementary interconnect power-on-reset signal POR_INT_B has a transition aligned with the slowest chip. The global complementary interconnect power-on-reset signal POR_INT_B is generated by inverting the global power-on-reset signal POR or ANDing the fabric chip generic power supply voltage present signal FAB_VCC_X_PRES and the base chip generic power supply voltage present signal BAS_VCC_X_PRES during the power down sequence. In the power up sequence, the timing of the state machine controlling the power up sequence can cause the transition of the global complementary interconnect power-on-reset signal POR_INT_B to transition from low to high at a point where contention current may be obviated by prior states and/or timing of the power up sequence.

In view of the preceding description, by aligning, during power down, the transition to low of the global complementary interconnect power-on-reset signal POR_INT_B to the tripping off of the slowest chip, the linking nodes 310, 320 in the configurable interconnect network can be pulled up by p-type transistors 330 to the voltage of the interconnect power supply node VCC_INT before or as each fabric chip 104-108 trips off. This can prevent or reduce a contention current through transmission gates of the configurable interconnect network.

Figure 9:
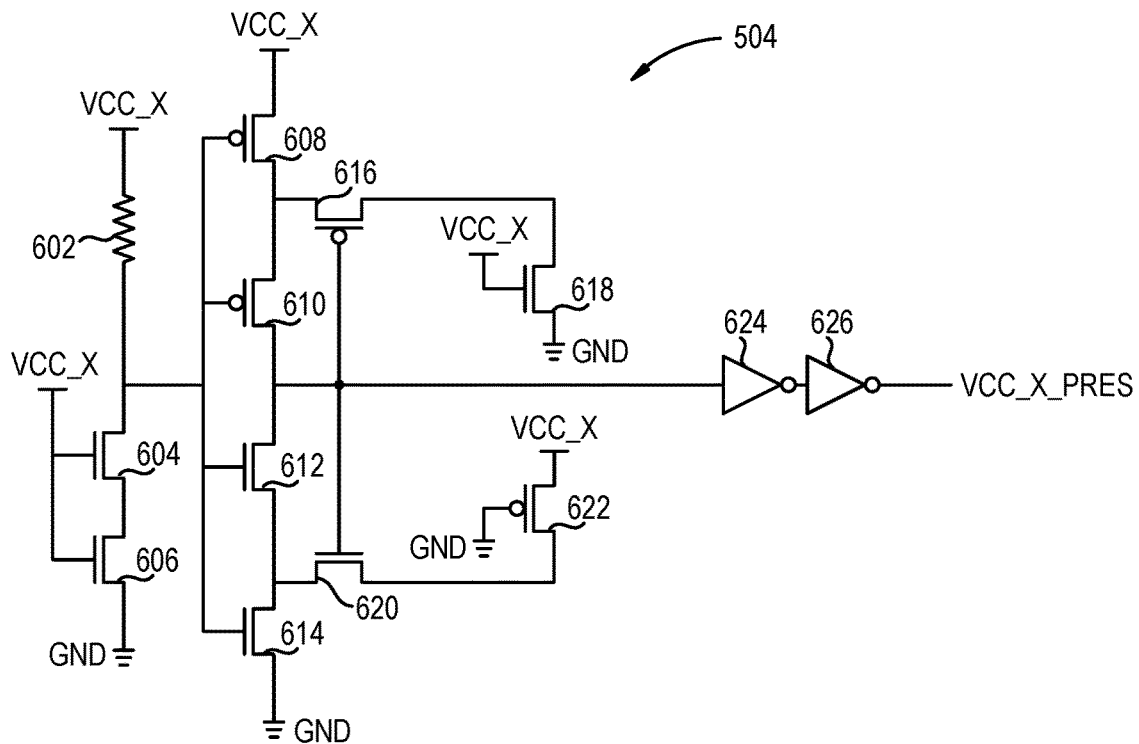
FIG. 9 is a circuit diagram of at least part of a detector circuit according to some examples.

FIG. 9 is a circuit diagram of at least part of a detector circuit 504 according to some examples. The detector circuit 504 can be implemented in any of the chips 102-108 to detect the presence of any power supply voltage. The detector circuit 504 is described generically with respect to any power domain, which is indicated by "X" in references. A detector circuit 504 may be implemented for each of the power domains for which a power supply is to be detected on a respective chip. The detector circuit 504 includes a resistor 602, n-type transistors 604, 606, 612, 614, 618, 620, p-type transistors 608, 610, 616, 622, and inverters 624, 626. The detector circuit is connected to a generic power supply node VCC_X and a generic power supply voltage present node VCC_X_PRES. For one detector circuit on a fabric chip 104-108, the generic power supply node VCC_X can be the interconnect power supply node VCC_INT on the fabric chip 104-108, and the generic power supply voltage present node VCC_X_PRES can be the interconnect power supply voltage present node VCC_INT_PRES on the fabric chip 104-108. For another detector circuit on the fabric chip 104-108, the generic power supply node VCC_X can be the CRAM power supply node VCC_RAM on the fabric chip 104-108, and the generic power supply voltage present node VCC_X_PRES can be the CRAM power supply voltage present node VCC_RAM_PRES on the fabric chip 104-108. Both detector circuits can be part of a detector circuit 504 on a fabric chip 104-108. Similarly, for one detector circuit on a base chip 102, the generic power supply node VCC_X can be the first power supply node 520 on the base chip 102, and the generic power supply voltage present node VCC_X_PRES can be the first power supply voltage present signal VCC_X_PRES on the base chip 102. For another detector circuit on the base chip 102, the generic power supply node VCC_X can be the second power supply node 522 on the base chip 102, and the generic power supply voltage present node VCC_X_PRES can be the second power supply voltage present signal VCC_X_PRES on the base chip 102. Both detector circuits can be part of a detector circuit 504 on a base chip 102.

The resistor 602 has a first terminal connected to the generic power supply node VCC_X, and has a second terminal connected to a drain of the n-type transistor 604 and to respective gates of transistors 608, 610, 612, 614. A source of the n-type transistor 604 is connected to a drain of the n-type transistor 606, and a source of the n-type transistor 606 is connected to a ground node GND. Gates of the n-type transistors 604, 606 are connected to the generic power supply node VCC_X.

A source of the p-type transistor 608 is connected to the generic power supply node VCC_X, and a drain of the p-type transistor 608 is connected to respective sources of the p-type transistors 610, 616. A drain of the p-type transistor 610 is connected to a drain of the n-type transistor 612, a gate of the p-type transistor 616, a gate of the n-type transistor 620, and an input node of the inverter 624. A source of the n-type transistor 612 is connected to a drain of the n-type transistor 614, and a source of the n-type transistor 614 is connected to a ground node GND. A drain of the p-type transistor 616 is connected to a drain of the n-type transistor 618, and a source of the n-type transistor 618 is connected to a ground node GND. A gate of the n-type transistor 618 is connected to the generic power supply node VCC_X. A drain of the n-type transistor 620 is connected to a drain of the p-type transistor 622, and a source of the p-type transistor 622 is connected to the generic power supply node VCC_X. A gate of the p-type transistor 622 is connected to a ground node GND. An output node of the inverter 624 is connected to an input node of the inverter 626, and an output node of the inverter 626 is the generic power supply voltage present node VCC_X_PRES.

Detailed operation of the detector circuit 504 will be readily understood by a person having ordinary skill in the art. Generally, the detector circuit 504 detects when the generic power supply voltage VCC_X on the generic power supply node VCC_X is above the trip voltage of the chip on which the detector circuit 504 is disposed. When the generic power supply voltage VCC_X is below the trip voltage, the signal on the generic power supply voltage present node VCC_X_PRES is low, and when the generic power supply voltage VCC_X is above the trip voltage, the signal on the generic power supply voltage present node VCC_X_PRES tracks the generic power supply voltage VCC_X (e.g., is logically high). Hence, the detector circuit 504 is configured to detect a presence of the generic power supply voltage VCC_X and responsively output the generic power supply voltage present node VCC_X_PRES.

Figure 10:
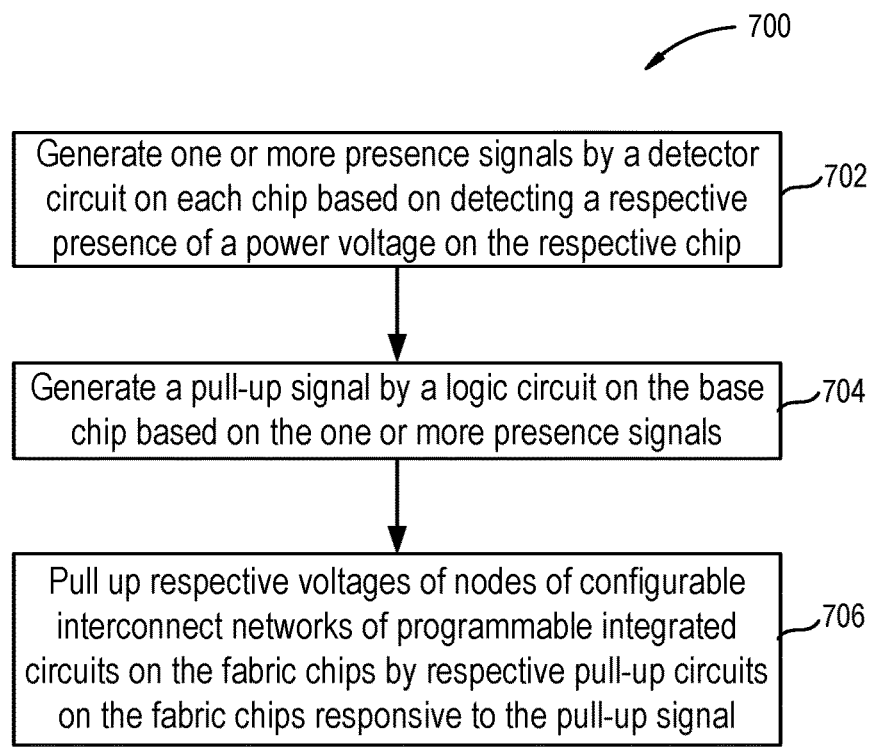
FIG. 10 is a flowchart of a method of operating a multi-chip device according to some examples.

FIG. 10 is a flowchart of a method 700 of operating a multi-chip device according to some examples. The multi-chip device can be as described above. At block 702, one or more presence signals are generated by a detector circuit on each chip based on detecting a respective presence of a power voltage on the respective chip. For example, the power voltage for fabric chips 104-108 can be the CRAM power supply voltage VCC_RAM and/or the interconnect power supply voltage VCC_INT, and the detection of the presence (e.g., above or below a trip voltage of the chip) of the CRAM power supply voltage VCC_RAM and/or the interconnect power supply voltage VCC_INT can cause the CRAM power supply voltage present signal VCC_RAM_PRES and/or the interconnect power supply voltage present signal VCC_INT_PRES, respectively, to be generated. The CRAM power supply voltage VCC_RAM and the interconnect power supply voltage VCC_INT can be applied on the CRAM power supply node VCC_RAM and the interconnect power supply node VCC_INT in the configurable interconnect network of the fabric chips 104-102 as shown in FIGS. 3 and 4. The power voltage for the base chip 102 can be the first power supply voltage and/or the second power supply voltage on the first power supply node 520 and second power supply node 522, respectively, and the detection of the presence (e.g., above or below a trip voltage of the chip) of the first power supply voltage and/or the second power supply voltage can cause the first power supply voltage present signal VCC_X_PRES and/or the second power supply voltage present signal VCC_X_PRES, respectively, to be generated. The power to the chips 102-108 can be output by a power supply circuit 508 on the base chip 102, and the power supply voltages whose presence are detected can be based on the power output by the power supply circuit 508, as described above.

At block 704, a pull-up signal is generated by a logic circuit on the base chip based on the one or more presence signals. For example, the complementary interconnect power-on-reset signal POR_INT_B can be generated by the logic circuit 506 on the base chip 102 based on one or more of the CRAM power supply voltage present signal VCC_RAM_PRES, the interconnect power supply voltage present signal VCC_INT_PRES, the first power supply voltage present signal VCC_X_PRES, and the second power supply voltage present signal VCC_X_PRES.

At block 706, respective voltages of nodes of configurable interconnect networks of the programmable ICs on the fabric chips are pulled up by respective pull-up circuits on the fabric chips responsive to the pull-up signal. For example, when the complementary interconnect power-on-reset signal POR_INT_B is low, the p-type transistors 330 pull up the voltages of the linking nodes 320, 310 of the configurable interconnect networks as described above. The configurable interconnect network can be as described above with respect to FIGS. 3 and 4.

While the foregoing is directed to specific examples, other and further examples may be devised without departing from the basic scope thereof, and the scope thereof is determined by the claims that follow.

What is claimed is:

1. A multi-chip device comprising:
a first chip including a power supply circuit and a logic circuit; and
a second chip coupled to the first chip, the second chip being configured to receive first power from the power supply circuit, the second chip including a first programmable circuit, a first pull-up circuit, and a first detector circuit, the first detector circuit being configured to detect a presence of a first power voltage on the second chip and responsively output a first presence signal, the first power voltage on the second chip being based on the first power from the power supply circuit, the logic circuit being configured to receive the first presence signal from the first detector circuit and generate a pull-up signal based on the first presence signal, the first pull-up circuit being configured to receive the pull-up signal from the logic circuit and configured to pull up a voltage of a node of the first programmable circuit responsive to the pull-up signal.

2. The multi-chip device of claim 1, wherein the second chip is bonded to the first chip.

3. The multi-chip device of claim 1, wherein the first programmable circuit includes configuration memory, the configuration memory being connected to a power node on which the first power voltage is applied.

4. The multi-chip device of claim 1, wherein the first pull-up circuit includes a transistor connected between the node of the first programmable circuit and a power node, the power supply circuit being configured to generate a second power voltage on the power node, the transistor having a gate connected to the logic circuit and configured to receive the pull-up signal.

5. The multi-chip device of claim 1, wherein:
the first detector circuit is configured to output a logically low value as the first presence signal when the first power voltage is below a trip voltage of the second chip and to output a logically high value as the first presence signal when the first power voltage is above the trip voltage of the second chip; and
the logic circuit is configured to output a logically low value as the pull-up signal when the first presence signal is a logically low value.

6. The multi-chip device of claim 1, wherein the first chip further includes a second detector circuit configured to detect a presence of a second power voltage on the first chip and responsively output a second presence signal, the second power voltage on the first chip being based on the first power from the power supply circuit, the logic circuit being configured to generate the pull-up signal based on the first presence signal and the second presence signal.

7. The multi-chip device of claim 1 further comprising a third chip coupled to the first chip, the third chip being configured to receive second power from the power supply circuit, the third chip including a second programmable circuit, a second pull-up circuit, and a second detector circuit, the second detector circuit being configured to detect a presence of a second power voltage on the third chip and responsively output a second presence signal, the second power voltage on the third chip being based on the second power from the power supply circuit, the logic circuit being configured to generate the pull-up signal based on the first presence signal and the second presence signal, the second pull-up circuit being configured to receive the pull-up signal and configured to pull up a voltage of a node of the second programmable circuit responsive to the pull-up signal.

8. The multi-chip device of claim 1, wherein:
the first programmable circuit includes a configurable interconnect network and configuration memory cells, each of the configuration memory cells being connected to a first power node on which the first power voltage is applied, each of the configuration memory cells including a storage node connected to a respective configurable circuit of the configurable interconnect network;
the first detector circuit is connected to the first power node and is configured to output a logically low value as the first presence signal when the first power voltage on the first power node is below a trip voltage of the second chip and to output a logically high value as the first presence signal when the first power voltage on the first power node is above the trip voltage of the second chip;
the logic circuit is configured to generate a logically low value as the pull-up signal when the first presence signal is a logically low value; and
the first pull-up circuit includes transistors connected between a second power node and respective nodes interconnected between two or more of the configurable circuits of the configurable interconnect network, each of the transistors being configured to pull the respective node up to a voltage of the second power node when the pull-up signal is a logically low value.

9. A method of operating a multi-chip device, the method comprising:
generating, by a first detector circuit on a first chip, a first presence signal based on detecting a presence of a power voltage on the first chip, the power voltage on the first chip being based on power from a power supply circuit on a second chip;
generating, by a logic circuit on the second chip, a pull-up signal based on the first presence signal, wherein the logic circuit on the second chip receives the first presence signal from the first detector circuit; and
pulling up, by a first pull-up circuit on the first chip, a voltage of a node of a first programmable circuit on the first chip responsive to the pull-up signal, wherein the first pull-up circuit receives the pull-up signal from the logic circuit on the second chip.

10. The method of claim 9, wherein the first chip is bonded to the second chip.

11. The method of claim 9, wherein the first programmable circuit includes configuration memory, the configuration memory being connected to a power node on which the power voltage is applied.

12. The method of claim 9, wherein:
generating the first presence signal comprises:
generating a logically low value as the first presence signal when the power voltage is detected as below a trip voltage of the first chip; and
generating a logically high value as the first presence signal when the power voltage is detected as above the trip voltage of the first chip; and
generating the pull-up signal comprises generating a logically low value as the pull-up signal when the first presence signal is a logically low value.

13. The method of claim 9 further comprising:
generating, by a second detector circuit on the second chip, a second presence signal based on detecting a presence of a power voltage on the second chip, the power voltage on the second chip being based on power from the power supply circuit, wherein the pull-up signal is generated based on the first presence signal and the second presence signal.

14. The method of claim 9 further comprising:
generating, by a second detector circuit on a third chip, a second presence signal based on detecting a presence of a power voltage on the third chip, the power voltage on the third chip being based on power from the power supply circuit on the second chip, wherein the pull-up signal is generated based on the first presence signal and the second presence signal; and
pulling up, by a second pull-up circuit on the third chip, a voltage of a node of a second programmable circuit on the third chip responsive to the pull-up signal.

15. The method of claim 9, wherein:
the first presence signal is generated based on detecting the presence of the power voltage on a first power node on the first chip, the first detector circuit being connected to the first power node, wherein a logically low value is generated as the first presence signal when the power voltage on the first power node is below a trip voltage of the first chip, and a logically high value is generated as the first presence signal when the power voltage on the first power node is above the trip voltage of the first chip;
a logically low value is generated as the pull-up signal when the first presence signal is a logically low value;
the node of the first programmable circuit is a node of a configurable interconnect network, a voltage of the node of the configurable interconnect network being pulled up to a voltage of a second power node when the pull-up signal is a logically low value; and
the first programmable circuit includes configuration memory cells, each of the configuration memory cells being connected to the first power node, each of the configuration memory cells including a storage node connected to a respective configurable circuit of the configurable interconnect network.

16. A multi-chip device comprising:
a chip stack comprising a plurality of chips, the plurality of chips comprising:
a first chip comprising a power management module, the power management module comprising a power supply circuit and a logic circuit, the power supply circuit being configured to output power; and a second chip comprising a first configurable interconnect network, first configuration memory cells, a first detector circuit, and a first pull-up circuit, each of the first configuration memory cells having a storage node connected to a respective first configurable element of the first configurable interconnect network, the first configuration memory cells being connected to a first power supply node, a first power supply voltage on the first power supply node being based on the power that is output by the power supply circuit, the first detector circuit being connected to the first power supply node and configured to detect a presence of the first power supply voltage on the first power supply node and responsively output a first presence signal, the logic circuit being connected to the first detector circuit and configured to receive the first presence signal from the first detector circuit and generate a pull-up signal on a pull-up node based on the first presence signal, the first pull-up circuit being connected to the pull-up node and configured to pull first linking nodes of the first configurable interconnect network up to a second power supply voltage on a second power supply node in response to the pull-up signal received from the logic circuit, each of the first linking nodes being connected between two or more of the first configurable elements of the first configurable interconnect network.

17. The multi-chip device of claim 16, wherein the second chip is bonded to the first chip.

18. The multi-chip device of claim 16, wherein the first chip further includes a second detector circuit being connected to a third power supply node and configured to detect a presence of a third power supply voltage on the third power supply node and responsively output a second presence signal, the logic circuit being connected to the second detector circuit and configured to generate the pull-up signal based on the first presence signal and the second presence signal.

19. The multi-chip device of claim 16, wherein the plurality of chips further comprises a third chip, the third chip comprising a second configurable interconnect network, second configuration memory cells, a second detector circuit, and a second pull-up circuit, each of the second configuration memory cells having a storage node connected to a respective second configurable element of the second configurable interconnect network, the second configuration memory cells being connected to a third power supply node, a third power supply voltage on the third power supply node being based on the power that is output by the power supply circuit, the second detector circuit being connected to the third power supply node and configured to detect a presence of the third power supply voltage on the third power supply node and responsively output a second presence signal, the logic circuit being connected to the second detector circuit and configured to generate the pull-up signal on the pull-up node based on the first presence signal and the second presence signal, the second pull-up circuit being connected to the pull-up node and configured to pull second linking nodes of the second configurable interconnect network up to a fourth power supply voltage on a fourth power supply node in response to the pull-up signal, each of the second linking nodes being connected between two or more of the second configurable elements of the second configurable interconnect network.

20. The multi-chip device of claim 19, wherein the third chip is bonded to the second chip.

* * * * *